US008689074B1

(12) United States Patent
Tai (10) Patent No.: US 8,689,074 B1
(45) Date of Patent: *Apr. 1, 2014

(54) METHOD AND APPARATUS FOR DETECTING TRAPPING SETS IN DECODING OF INFORMATION

(75) Inventor: Ying Y. Tai, Sunnyvale, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 339 days.

This patent is subject to a terminal disclaimer.

(21) Appl. No.: 13/170,047

(22) Filed: Jun. 27, 2011

(51) Int. Cl.
*H03M 13/00* (2006.01)
*G06F 11/00* (2006.01)

(52) U.S. Cl.
USPC .............................. 714/752; 714/774; 714/24

(58) Field of Classification Search
USPC ......... 714/774, 752, 746, 780, 795, 799, 800, 714/745, 24
See application file for complete search history.

(56) References Cited

U.S. PATENT DOCUMENTS

| 7,587,657 | B2 * | 9/2009 | Haratsch | 714/780 |
| 8,423,869 | B2 * | 4/2013 | Shimanuki | 714/774 |
| 8,433,970 | B2 * | 4/2013 | Rault et al. | 714/752 |

OTHER PUBLICATIONS

R. G. Gallager, "Low-density parity-check codes" IRE Trans. Information Theory, vol. IT-8, pp. 21-28, Jan. 1962.
D. MacKay, "Good error-correcting codes based on very sparse matrices" IEEE Trans. on Information Theory, vol. 45, No. 2, pp. 399-431, Mar. 1999.
T. Richardson et al., "The capacity of low-density-parity-check codes under message-passing decoding" IEEE Trans. on Information Theory, vol. 47, No. 2, pp. 599-618, Feb. 2001.
D. MacKay et al., "Weakness of margulis and ramanujan-margulis low-density-parity-check codes" Electronic Notes in Theoretical Computer Science, vol. 74, pp. 1-8, 2003.
T. Richardson, "Error floor of LDPC codes" In Proc. of the 41st Annual Allerton Conference, pp. 1426-1435 Oct. 2003.
R. Tanner, "A recursive approach to low complexity codes" IEEE Trans. On Information Theory, vol. 27, No. 5, pp. 533-547, Sep. 1981.
Y. Han. et al., "Low-Floor decoder for LDPC codes" IEEE Trans. on Communications, vol. 57, No. 6, pp. 1663-1673, Jun. 2009.
Z. Zhang et al., "Lowering LDPC error floors by postprocessing" Proc. IEEE GlobeCom Conference, New Orleans, LA, Nov. 2008.
Y. Kou et al., "Low density parity check codes based on finite geometries: a rediscovery and new results" IEEE Trans. on Information Theory, vol. 47, No. 7, pp. 2711-2736, Nov. 2001.
Ryan et al., "Channel codes classical and modern" Cambridge University Press, pp. 133-142, Sep. 2009.
Tanner "Spectral graphs for quasi-cyclic LDPC codes" in proc. IEEE Int. Symp. Inform. Theory, pp. 226, Jun. 2001.

(Continued)

*Primary Examiner* — Christine Tu
(74) *Attorney, Agent, or Firm* — Sawyer Law Group, P.C.

(57) ABSTRACT

Decoding information using error-correcting codes includes, in one aspect, receiving transmitted information that includes original information coded using an error correction coding technique, and using at least one processor to iteratively decode the transmitted information to correct transmission errors and determine the original information. The iterative decoding includes determining that the iterative decoding has become trapped in a trapping set before a predetermined maximum number of iterations has been performed. Some embodiments allow that, in response to determining the trapping set, an exit can be performed from the iterative decoding before the predetermined maximum number of iterations has been performed.

20 Claims, 5 Drawing Sheets

(56) References Cited

OTHER PUBLICATIONS

Chen et al., "Near optimum universal belief propagation based decoding of low-density parity-check codes" IEEE Trans. on Communications, vol. 50, No. 3, pp. 406-414, Mar. 2002.

Fossorier et al. "Reduced complexity iterative decoding of low density parity check codes" IEEE Trans. on Communications, vol. 47, No. 5, pp. 673-680, May 1999.

Chen et al., "Density evolution for two improved BP-based decoding algorithms of LDPC codes" IEEE Communications Letters, vol. 6, No. 5, pp. 208-210, May 2002.

* cited by examiner

METHOD AND APPARATUS FOR DETECTING TRAPPING SETS IN DECODING OF INFORMATION

CROSS REFERENCE TO RELATED APPLICATIONS

The present application is related to copending U.S. patent application Ser. No. 13/170,072, entitled "Method and Apparatus for Breaking Trapping Sets in Decoding of Information," filed on even date herewith and assigned to the assignee of the present application.

FIELD OF THE INVENTION

The present inventions relate to decoding information, and more particularly to iterative decoding of information.

BACKGROUND OF THE INVENTION

Communication of information between electronic devices or components thereof can be implemented using any of a variety of different techniques and technologies. Coding and error correction techniques can be used to correct and reduce errors in received signals introduced from noise, distortion and other disturbances, the techniques implemented using encoders and decoders. One form of linear block codes rediscovered in the early 2000s and which has become the focal point in error correcting coding (ECC) is Low-Density Parity-Check (LDPC) codes. This coding can provide performance very closed to the channel capacity using an iterative soft-decision decoding approach. Many practical applications have adopted LDPC codes to obtain superior bit error rate (BER) performance.

LDPC decoding can use message-passing algorithms to achieve fast decrease in the error rate with an increase in the signal-to-noise ratio (SNR). However, with the use of message-passing algorithms, most LDPC codes suffer a weakness known as error-floor in which the error rate decreases more slowly or flattens out with an increase in SNR. In some applications, such as storage systems, the error-floor is required to be lower than a particular level of bit error rate (BER). For example, some flash memory systems and storage systems require the error-floor to be as low as $10^{-15}$ to $10^{-18}$ of BER.

Error-floors are mainly attributed to a particular combinatorial structure in the codes' Tanner graphs known as trapping sets (also known as near-codewords, or stopping sets in some applications; all are collectively referred to as "trapping sets" herein). Trapping sets trap the message-passing algorithms to prevent decoding from converging to the correct codeword. After awareness of the phenomenon of error-floors of LDPC codes with message-passing algorithms, some techniques to lower the error-floor have been developed. For example, bit-pinning, generalized-LDPC (G-LDPC) decoding, concatenation, bi-mode decoding, and combinations of these approaches have been used or suggested. However, these techniques have disadvantages. For example, some of these techniques such as concatenation result in a loss of code rate and coding gain in the waterfall region of BER and may also require a second decoder that increases decoding complexity and latency. Several of the techniques need prior knowledge of the structure of the harmful trapping sets, and/or are customized for specific codes, i.e., designed for specific LDPC codes such as 10GBASE-T Ethernet, which limits their usefulness.

SUMMARY OF THE INVENTION

Decoding techniques for information using error-correcting codes are disclosed. In one aspect, a method for decoding information includes receiving transmitted information that includes original information coded using an error correction coding technique. At least one processor is used to iteratively decode the transmitted information to correct transmission errors and determine the original information, the iterative decoding having a predetermined maximum number of iterations. The iterative decoding includes determining that the iterative decoding has become trapped in a trapping set before the predetermined maximum number of iterations has been performed. In some embodiments, in response to determining that the iterative decoding has become trapped in a trapping set, an exit can be performed from the iterative decoding before the predetermined maximum number of iterations has been performed. A similar aspect is provided for a computer program product comprising a computer readable medium including program instructions for implementing similar features.

In another aspect, an apparatus for decoding information includes a memory and at least one processor in communication with the memory. The at least one processor receives transmitted information that includes original information coded using an error correction coding technique, and implements a decoder to iteratively decode the transmitted information to correct transmission errors and determine the original information. The iterative decoding has a predetermined maximum number of iterations and includes determining that the iterative decoding has become trapped in a trapping set and performing an exit from the iterative decoding before the predetermined maximum number of iterations has been performed.

Embodiments disclosed herein allow the decoding of information by error-correcting codes to be more efficient. For example, computation and latency can be reduced and error-floor can be reduced efficiently and with wide application, without regard to a specific code or decoding technique and without requiring prior knowledge of a code's structures of trapping sets.

DETAILED DESCRIPTION

The present embodiments relate to decoding information and more particularly to iterative decoding of information. Various modifications to the described embodiments and the generic principles and features described herein will be readily apparent to those skilled in the art. Thus, the present embodiments are not intended to be limited to the examples shown but is to be accorded the widest scope consistent with the principles and features described herein.

The present embodiments are mainly described in terms of particular methods and systems provided in particular implementations. However, one of ordinary skill in the art will readily recognize that these methods and systems will operate effectively in other implementations. For example, system implementations usable with the present embodiments can take a number of different forms. The present embodiments will also be described in the context of particular methods having certain steps. However, the methods and systems operate effectively for other methods having different and/or additional steps not inconsistent with the present embodiments.

The modified decoding embodiments described herein can take the form of software embodiments, hardware embodiments, or an embodiments containing both hardware and software elements. A software embodiment can include but is not limited to firmware, resident software, microcode, etc. run by a processor or processing circuit. Furthermore, some embodiments can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable storage medium include a semiconductor or solid state memory, magnetic tape, a removable computer diskette, a random access memory (RAM), a read-only memory (ROM), flash memory, a rigid magnetic disk, an optical disk, and a solid-state memory drive. Current examples of optical disks include compact disk read only memory (CD-ROM), compact disk read/write (CD-R/W), DVD, and Blu-ray.

The embodiments herein enable decoding of codes such as LDPC codes and similar information that has been coded using an error correction coding technique to detect and/or overcome the effects of trapping sets. The modified decoding techniques described herein require no prior knowledge of the structure of the trapping sets and function well for many types of codes, such as all types of LDPC codes. These techniques work effectively and have low complexity in implementation.

To more particularly describe the features of the described embodiments, please refer to FIGS. 1-6 in conjunction with the discussion below.

Figure 1:
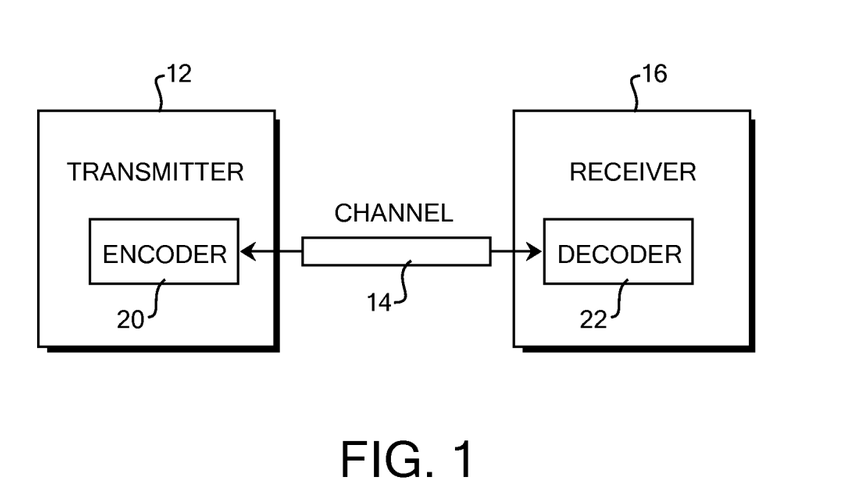
FIG. 1 is a block diagram illustrating a communication system suitable for use with the modified decoding embodiments described herein.
Figure 4:
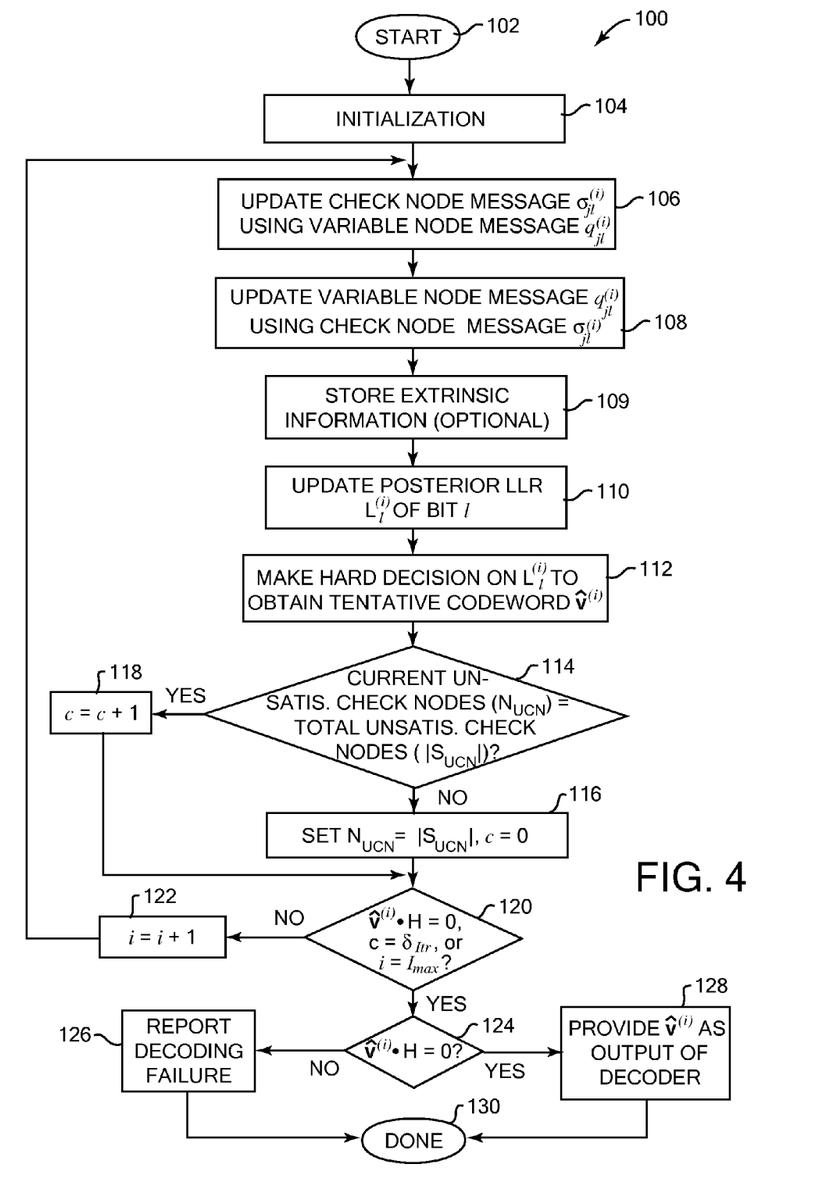
FIG. 4 is a flow diagram illustrating a method for a message-passing technique suitable for reducing the error-floor of coded information.
Figure 5:
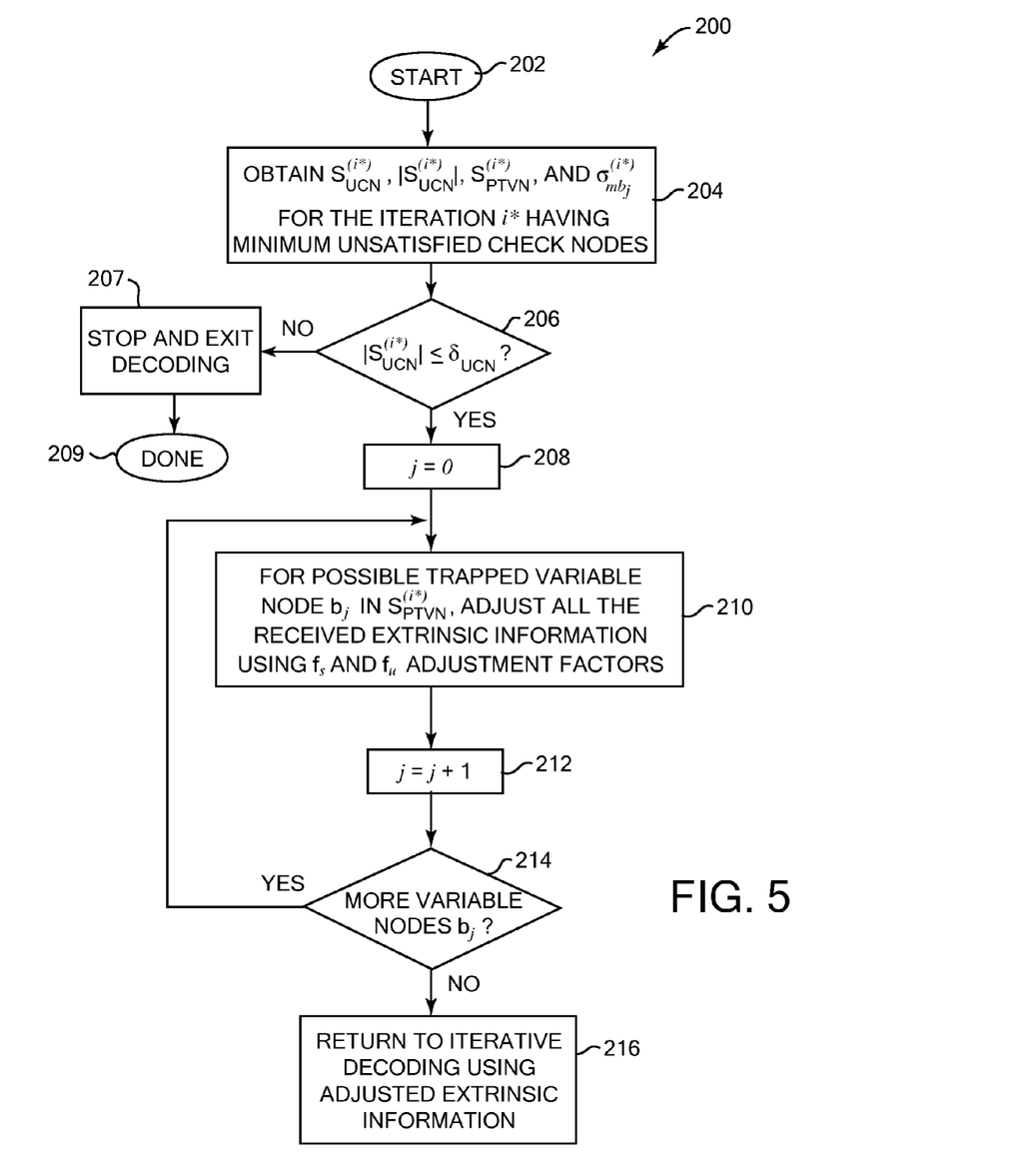
FIG. 5 is a flow diagram illustrating a method for breaking harmful trapping sets in an iterative decoding process.

FIG. 1 is a block diagram illustrating a communication system 10 suitable for use with the modified decoding embodiments described herein, such as the embodiments associated with FIGS. 4-5. System 10 includes a transmitter 12, a channel 14, and a receiver 16. Transmitter 12 can be any computer system, or component in a computer system, that is sending information over the channel 14 to another system or component. For example, the transmitter 12 can be included in a computer system, such as an electronic device, a desktop computer, laptop computer, server, workstation, cell phone, video game system or device, tablet, portable device, etc. In other embodiments, the transmitter 12 can be a component within an electronic device, such as a microprocessor block, memory block, or other component.

Transmitter 12 includes an encoder 20 for encoding information into a form that can be decoded and error-corrected by compatible receivers such as receiver 16, enabling transmitted data to be less susceptible to noise. In the described embodiments, encoder 20 is an LDPC encoder in which data is encoded using LDPC codes for transmission. Other embodiments can use other types of encoding having appropriately similar decoding techniques. The encoder 20 receives original information from a source at the transmitter end, such as a memory or microprocessor, codes the original information using LDPC codes, and outputs coded information that is transmitted on the channel 14 as signals by well-known components of the transmitter 12 (modulator, etc., not shown).

Channel 14 can be any suitable communication channel for sending and receiving information in the form of electronic signals. For example, channel 14 can be a wire or cable, as required by a particular communication standard such as Ethernet. Channel 14 can alternatively be the air or similar medium, in which the communication is wireless. Channel 14 propagates the coded information provided by the transmitter 12.

Receiver 16 receives signals sent by transmitter 12 over the channel 14. Similarly to the transmitter 12, the receiver can be a computer system or a component in a computer system that receives the coded information, such as a computer, portable device, memory, microprocessor, storage device, etc. For example, receiver 16 can be in a separate computer system from the transmitter 12, or the receiver 16 can be a component in the same computer system as transmitter 12. The receiver 16 can be implemented by a processor or processing circuit, such as logic circuitry or one or more processors (e.g. microprocessors) within a computer system, within the receiver 16, or by different logic in the system 10.

The receiver 16 includes a decoder 22 which receives the transmitted coded information (appropriately processed, e.g., using a demodulator or other processing, not shown) and attempts to reconstruct the original source information knowing the coding technique used by the encoder 20. In the embodiments described herein, the decoder 22 is an LDPC decoder able to reconstruct the original information using LDPC codes and an iterative decoding process, as described below, which allows the correct original information to be determined even if corrupted by noise or other errors during transmission. The decoder 22 can be implemented by a processor or processing circuit as described above.

Various systems can make use of the modified decoding techniques described herein, especially systems requiring a very low error floor for BER. For example, flash memory systems, wired or wireless communications, data transmission, and data storage systems can make use of the error correcting coding and decoding described herein.

Figure 2:
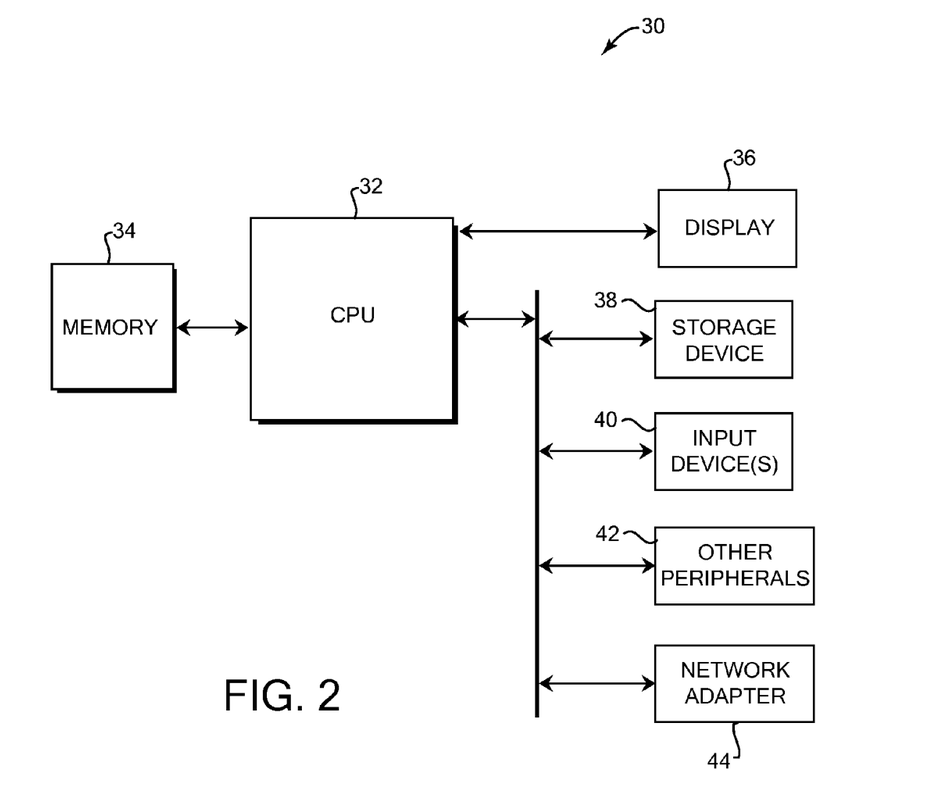
FIG. 2 is a block diagram illustrating one example of a computer system suitable for use with the modified decoding embodiments disclosed herein.

FIG. 2 is a block diagram illustrating one example of a computer system 30 suitable for use with the embodiments disclosed herein, such as the embodiments associated with FIGS. 4-5. System 30 can include, implement, and/or be connected to, the receiver 22 described with reference to FIG. 1, for example. A similar or different system can include, implement, and/or be connected to the transmitter 20 described with reference to FIG. 1. System 30 can be any suitable computer system or other electronic or hardware device. For example, the system 30 can be a mainframe computer, desktop computer, server, workstation, portable computer, or electronic device (set-top box, portable device, cell phone, personal digital assistant, media player, game device, etc.). System 30 includes a CPU 32, memory 34, display device 36, storage device 38, input device(s) 40, and other peripherals 42.

CPU 32 can be one or more microprocessors or other processors to execute program code and control basic operations of the system 30, including processing operations, manipulating data, issuing commands to other components of the system 30, etc. In some embodiments, CPU 32 can also implement the modified decoding techniques described herein. In other embodiments, one or more different processors or processing circuitry in system 30 and/or in the decoder 22 (not shown) can implement the decoding techniques. Memory 34 is typically provided in system 30 for access by the CPU 32, and can include one or more of a variety of types, such as random access memory (RAM), read-only memory (ROM), Electrical Erasable Read-only Memory (EEPROM), Flash memory, etc. Memory 34 can be used to store information and can store temporary or long-term information used in the modified decoding techniques described herein. Other embodiments can use other memory (not shown) dedicated for use with the decoding processes.

Display device 36 outputs displayed images to a user of the system 30. Display device 36 can be any of a variety of types of displays, including LCD, LED, Plasma, CRT, etc. Storage device 38 can store data that may be retrieved by the CPU (including program instructions and/or data for the decoding processes in some embodiments), and can be any of a variety of devices such as a hard disk, CD-ROM, DVD-ROM, Blu-Ray disc, flash memory or solid-state drive, magnetic tape, etc. Input devices 40 can include any of a variety of devices that allow users to input commands and data to the CPU, including a keyboard, mouse, trackball, stylus, touchscreen, microphone/voice recognition device, motion sensors, other electronic device (such as another computer system or portable electronic device), or other input device. Other peripherals 42 can include any other devices connected to and used by the system 30, such as any peripheral, card, or interface device that performs one or more functions and communicates with the system 30, e.g., scanners, printers, sensors, speakers, etc.

A network adapter 44 can be included in some embodiments as one peripheral that enables communication over a network connected to the system 30. For example, the network adapter 44 can include the receiver 16 and/or a transmitter 12, so that the system 30 can communicate with other computer systems or devices through intervening private or public networks and allowing the system 30 to, for example, receive LDPC coded signals from the transmitter 12 in a different computer system or device. In the example of FIG. 1, the display device 36 is connected to the CPU 32 by its own dedicated bus, while storage device 38, input devices 40, and other peripherals 42 and 44 are connected to a common bus that is also connected to the CPU. In other embodiments, the display device 36 and other devices can each have their own bus, or share one or more common buses. One or more of the buses or other links can be implemented using wires or wirelessly, according to any of well known standards and protocols.

In some embodiments, the modified decoding techniques described herein can be implemented by the CPU 32 on information received via network peripheral 44 from the transmitter 12 provided in a different system. Alternatively, one or more different processors or logic can implement the decoding, via hardware logic and/or software. The decoding techniques are described in greater detail below.

LDPC Codes and Message-passing Techniques

LDPC codes are used in an LDPC error correction coding technique to code transmitted original information and decode the original information in received information. For example, transmitted information received over a channel may in the form of frames or other structure, and include original information bits and parity check bits. The decoding process can recover the original information accurately despite errors introduced in the transmission process (within a particular error rate). Different codewords (legal configurations of bits) are determined during decoding, until the process converges on the correct codeword that corresponds to the original information.

A binary regular LDPC code is defined as the null space of a sparse parity-check matrix H over a binary Galois Field, GF(2), that has following structural properties: (1) each column has $\gamma$ 1-components; (2) each row has $\rho$ 1-components; (3) no two rows (or two columns) have more than one 1-component in common; and (4) both $\gamma$ and $\rho$ are small compared to length of the code. Properties (1) and (2) say that the parity-check matrix H has constant column and row weights $\gamma$ and $\rho$, respectively. Property (3) is referred as the row-column (RC) constraint. Because of property (4), H therefore has a small density of 1-components. For this reason, H is said to be a sparse parity-check matrix, and the code specified by H is hence called a Low Density Parity Check (LDPC) code.

The LDPC code given by above definition is called a $(\gamma,\rho)$-regular LDPC code. If the parity-check matrix H has varying column weight and/or varying row weights, an LDPC code is said to be irregular. If H is an array of sparse circulants of the same size over GF(2), its null space gives a quasi-cyclic (QC)-LDPC code. If H is a single sparse circulant or a column of sparse circulants, the null space of H gives a cyclic LDPC code.

Several message-passing decoding techniques for LDPC codes have been proposed, providing iterative decoding procedures. Of these, the sum-product algorithm (SPA) typically provides the best performance compared with the other techniques. Although SPA decoding achieves better performance, the hardware implementation of SPA is limited by its complexity. Three reduced complexity iterative decoding techniques based on SPA have been proposed, min-sum decoding (MSA), normalized min-sum decoding (NMSA), and offset min-sum decoding (OMSA). These three techniques only need real number additions and comparisons. They all achieve good tradeoff between complexity and error performance.

Figure 3:
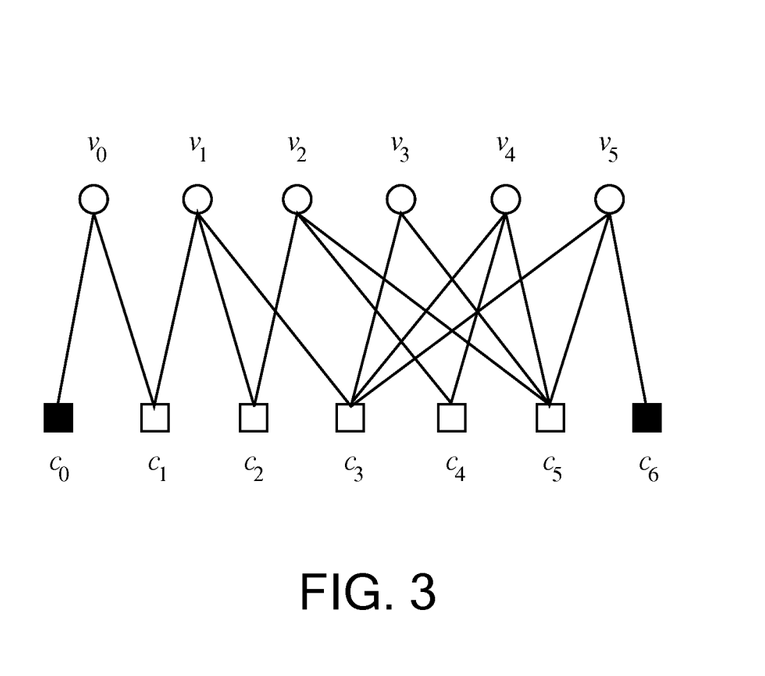
FIG. 3 is an example of a Tanner graph showing variable nodes and check nodes used in iterative decoding disclosed herein.

The soft-decision message-passing decoding techniques for LDPC codes operate on Tanner graphs defined by the matrix H having a set of variable nodes (number of bits in a codeword) and a set of check nodes (number of parity check bits). An example of a Tanner graph having such variable nodes and check nodes is shown in FIG. 3, where variable nodes v are organized on one side of the bipartite graph and the check nodes c are organized on the other side, with connections shown between the nodes. The variable nodes represent the code bits of a codeword in the code, and the check nodes represent the parity checksum constraints that the code bits must satisfy. A check node is considered satisfied if its corresponding checksum constraint is satisfied. The variable nodes correspond to the columns of the parity-check matrix H and the check nodes correspond to the rows of the matrix H.

The message-passing decoding techniques are iterative such that at each iterative pass, soft information ("messages") are passed from variable nodes to check nodes, and from check nodes back to variable nodes. The decoding iteratively sends updated reliabilities of each symbol forward and backward as messages between variable nodes and check nodes in a Tanner graph until a certain stopping criterion is satisfied. The reliabilities indicate probabilities that the codeword bit associated with a particular value is indicated in the message, also known as belief propagation. During a decoding iteration, the messages from satisfied check nodes try to reinforce the current decoder state, and messages from the unsatisfied check nodes try to change some of the bit decisions to satisfy their constraints.

Hard decisions are made at the end of decoding. If an estimated codeword satisfies all the parity check equations, then the decoding has produced a successful decoded codeword. When the decoding produces a non-codeword that does not satisfy all the parity check equations, i.e. includes errors, then a decoding failure has occurred.

In the following example, BPSK (Binary Phase Shift Keying) transmission is assumed over an AWGN (Additive White Gaussian Noise) channel with binary input ±1 and noise of zero mean and variance $\sigma^2 = N_0/2$.

Consider an LDPC code C whose parity-check matrix has n columns and J rows. Let $h_0, h_1, \ldots, h_{J-1}$ be the row vectors of H. For $0 \leq j < J$ and $0 \leq l < n$, define the index sets as follows:

$$A_l = \{j : h_{jl} = 1, 0 \leq j < J\},$$

$$B_j = \{l : h_{jl} = 1, 0 \leq l < n\}.$$

Consider a codeword $v = (v_0, v_1, \ldots, v_{n-1})$ in C. Let $x = (x_0, x_1, \ldots, x_{n-1})$ be the transmitted sequence through the AWGN channel and $y = (y_0, y_1, \ldots, y_{n-1})$ be the sequence of samples at the output of the channel receiver sampler. The codeword v can be mapped to x according to the mapping function $x_i = M(v_i) = 2v_i - 1$ for $0 \leq i < n$. The samples of y are real numbers with $y_i = x_i + n_i$ for $0 \leq i < n$, where $n_i$ is a Gaussian random variable (e.g., caused by noise in a transmission channel) with zero-mean and variance $N_0/2$. The sequence of y is also commonly called a soft-decision received sequence.

Let $y^{LLR} = (y_0^{LLR}, y_1^{LLR}, \ldots, y_{n-1}^{LLR})$ be the sequence of log-likelihood-ratios (LLR) associated with the received sequence y. The LLRs are logarithms of the ratio of two probabilities, e.g., the ratio of the probability that the number y is equal to 1 (i.e., that the original signal was 1) over the probability that y is equal to 0 (i.e., that the original signal was 0). Herein, these received-sequence LLRs are also known as "intrinsic information," where intrinsic information of a code bit is the mutual information of the channel. For example, x is transmitted through the channel and received as y, so that in this example, $y^{LLR}$ is intrinsic information. In contrast, "extrinsic information" herein refers to the messages (information) exchanged between variable nodes and check nodes (e.g., σ and q as discussed below), inside the decoder, such as extrinsic LLRs. The decoded bits are determined using both intrinsic information and extrinsic information.

For $0 \leq j < J$ and $0 \leq l < n$ and i-th iteration, the following two quantities are defined, which are the messages (i.e., extrinsic information) sent between variable nodes and check nodes:

(1) $q_{jl}^{(i)}$: the LLR of bit l obtained via check sums $h_t$ where $t \in A_l \setminus j$. It is sent from variable node l to check node j.

(2) $\sigma_{jl}^{(i)}$: the LLR of bit l such that the checksum equation $s_j = 0$ and the other bits have LLRs $\{q_{jt}^{(i)} : t \in B_j \setminus l\}$. It is sent from check node j to variable node l.

These two types of messages are used to update each other according to the following equations when using SPA message-passing decoding:

$$\sigma_{jl}^{(i)} = \log \frac{1 - T_{jl}^{(i)}}{1 + T_{jl}^{(i)}}, \quad (1)$$

where, $$T_{jl}^{(i)} = \prod_{l' \in B_j \setminus l} \frac{1 - e^{q_{jl'}^{(i)}}}{1 + e^{q_{jl'}^{(i)}}}, \quad (2)$$

and $$q_{jl}^{(i+1)} = y_l^{LLR} + \sum_{j' \in A_l \setminus j} \sigma_{j'l}^{(i)} \quad (3)$$

The equations (1) and (2) can be simplified when using MSA message-passing decoding to use the following equation:

$$\sigma_{jl}^{(i)} = \min_{l' \in B_j \setminus l} |q_{jl'}^{(i)}| \cdot \prod_{l' \in B_j \setminus l} \mathrm{sign}(q_{jl'}^{(i)}) \quad (4)$$

At the end of each iteration, the posterior LLR of bit l, denoted by $L_l^{(i)}$, can be computed using the messages transmitted from the check nodes back to the variable nodes, as below:

$$L_l^{(i)} = y_l^{LLR} + \sum_{j \in A_l} \sigma_{jl}^{(i)}. \quad (5)$$

Based on these posterior LLRs, hard decisions can be made to obtain an estimate $(\hat{v}^{(i)} = (\hat{v}_0^{(i)}, \hat{v}_1^{(i)}, \ldots, \hat{v}_{n-1}^{(i)}))$ of the codeword v using the following rule:

$$\hat{v}_l^{(i)} = \begin{cases} 1 & \text{if } L_l^{(i)} > 0, \\ 0 & \text{if } L_l^{(i)} \leq 0. \end{cases} \quad (6)$$

The estimate $\hat{v}^{(i)}$ is also referred as the i-th decoder state.

One example of a standard, previous message-passing decoding technique for LDPC codes can be summarized in the following steps ($0 \leq j < J$, $0 \leq l < n$):

Initialization:
Set current iteration number i=0, maximum number of iterations to $I_{max}$. Set $q_{jl}^{(0)} = y_l^{LLR}$.

Step 1 (Horizontal):
Compute and update $\sigma_{jl}^{(i)}$ by Equations (1) and (2) for SPA, or (4) for MSA.

Step 2 (Vertical):
Compute and update $q_{jl}^{(i)}$ and $L_l^{(i)}$ by equations (3) and (5). Make hard decisions on $L_l^{(i)}$ by equation (6) to obtain a tentative codeword (i.e., the decoder state of i-th iteration) $\hat{v}^{(i)}$. If $\hat{v}^{(i)} \cdot H = 0$ or $I = I_{max}$, go to Step 3; otherwise i=i+1 and go to Step 1.

Step 3 (Termination):
Take $\hat{v}^{(i)}$ as the output of the decoder. Report a decoding failure if $\hat{v}^{(i)} \cdot H \neq 0$ (if this is the case, the maximum amount of iterations have been performed).

Trapping Sets in Iterative Decoding

In the Tanner graph of an LDPC code, a trapping set is known as a set with relatively small number of variable nodes such that the induced subgraph has only a small number of odd-degree check nodes. A trapping set with a variable nodes and b odd-degree check nodes is called an (a, b) trapping set. For example, a (6,2) trapping set is shown in FIG. 3, where the two odd-degree check nodes are $c_0$ and $c_6$. The checksums corresponding to the b odd-degree check nodes will not be satisfied if the code bits associated with the a variable nodes are all the wrong bits. These b odd-degree check nodes are unsatisfied check nodes, and the variable nodes connected to the b unsatisfied check nodes in an (a, b) trapping set are referred as trapped variable nodes.

In iterative decoding, the updated message of each code bit is sent forward and backward between the variable nodes and check nodes. After some number of iterations, if the wrong bits coincide with the variable nodes of a trapping set, the decoder starts to get trapped. In other words, the decoder cannot converge to a codeword even if many more iterations are performed, resulting in an error-floor.

Lowering the Error-Floor of LDPC Codes

The embodiments described herein provide modified decoding techniques to increase efficiency in the decoding process and lower the error-floor of LDPC codes and other error correction codes in comparison with the standard message-passing decoding techniques such as described above.

Detection of Trapping Sets and Early Exit from Decoding

The standard iterative decoding declares a failure due to small trapping sets if it does not converge to a codeword after performing the maximum number $I_{max}$ of iterations. In the following embodiments, a process is described to determine whether the iterative decoding has become trapped in a trapping set before the maximum number of iterations has been performed, allowing early exit of the decoding process.

Two types of behaviors of the decoding failures caused by small trapping sets are observed: 1) false convergence occurs if the decoder reaches a fixed state $\hat{v}^{(i)}$ and stays unchanged for the following iterations; and 2) oscillation occurs if the decoder oscillates among a set of states $\{v^{(i)}\}$ and returns to the starting trapping set periodically. These two types of behaviors are denoted herein as "type-1 behavior" and "type-2 behavior," respectively.

For any given iteration i, the decoder described herein can identify the set $S_{UCN}^{(i)}$ of unsatisfied check nodes, the number $|S_{UCN}^{(i)}|$ of unsatisfied check nodes in $S_{UCN}^{(i)}$ and the decoder state $\hat{v}^{(i)}$. If a decoding failure belongs to type-1 behavior, the decoder state $\hat{v}^{(i)}$ stays unchanged after some iterations and hence $|S_{UCN}^{(i)}|$ also stays unchanged. As a result, if $|S_{UCN}^{(i)}|$ stays unchanged for $\delta_{Itr}$ consecutive iterations ($\delta_{Itr} < I_{max}$) during the decoding process, the decoding failure falls to type-1 behavior and hence the decoding can be stopped, where $\delta_{Itr}$ is a predetermined stop threshold. In this case, the decoder does not need to perform $I_{max}$ iterations. Therefore, stopping the iterative decoding before $I_{max}$ iterations have been performed, as accomplished herein, reduces computation and decoding latency. If the decoding failure belongs to type-2 behavior, the decoder will perform $I_{max}$ iterations. Thus, if I is the number of iterations that the decoder performs before it stops, then iterations I can be any integer number between $\delta_{Itr}$ and $I_{max}$, i.e. $\delta_{Itr} \leq I \leq I_{max}$ for type-1 behavior, and I equals $I_{max}$ for type-2 behavior.

FIG. 4 illustrates one embodiment of a method 100 for a message-passing iterative decoding technique that includes early detection of trapping sets. Method 100 can be implemented in a decoder by one or more processors or processing circuits, such as one or more microprocessors controlled by software, hardware logic, application-specific integrated circuit(s) (ASICs), field-programmable gate array(s) (FPGA), etc. In one example, a receiver or other component can implement method 100 as part of a decoder providing a decoding process for coded transmitted information received over a channel as described above with reference to FIG. 1.

The method 100 can be used in any iterative message-passing decoding process that decodes utilizing an error correction coding technique, such as LDPC techniques SPA or MSA. Original information has been coded with an error correction coding technique, e.g. including coding information, and transmitted to the receiver which performs the decoding to retrieve the original information and correct any errors introduced in the transmission. The decoding process produces a codeword representing original information, which has been recovered without errors if the codeword satisfies all the constraints of the check nodes provided by the Tanner graph representations of the coded information.

The method 100 begins at 102, and in step 104, initialization is performed. For example, this initialization can include setting the current iteration number i=0, the maximum number of iterations to a predetermined number $I_{max}$, the first message $q_{jl}^{(0)}$ to the first check nodes set to $y_l^{LLR}$, the current number of unsatisfied check nodes $N_{UNC}$ to 0, the iteration counter c to 0, and the stop threshold $\delta_{Itr}$ to a predetermined value. The stop threshold $\delta_{Itr}$ can be determined based on simulation or experiment; for example, this parameter can range in value from 3 to 5 as in examples described below. The larger the stop threshold, the more accurate the result, but the less computation saved relative to processing the maximum number $I_{max}$ of iterations.

In step 106, the messages $\sigma_{jl}^{(i)}$ to be sent from the check nodes j to the variable nodes l of the Tanner graph representative of the code are computed and updated using the messages $q_{jl}^{(i)}$ from the last iteration. If using an SPA technique, then the equations (1) and (2) described above can be used to determine the messages $\sigma_{jl}^{(i)}$. If using an MSA technique, then the equation (4) described above can be used. The messages are LLR values (extrinsic information) indicating reliabilities as described above. Other message passing techniques can be used in method 100 in other embodiments, and use appropriate message equations.

In step 108, the messages $q_{jl}^{(i)}$ to be sent from the variable nodes l to check nodes j are computed and updated using the messages $\sigma_{jq}^{(i)}$ from the current iteration. The equation (3) described above can be used to determine the messages whether using an SPA or MSA technique. Thus, messages are computed based on parity constraints at each check node and returned to neighboring variable nodes, and each variable node then updates its decision based on the channel output $y^{LLR}$ (intrinsic information) and the messages (extrinsic information) received from the neighboring check nodes.

If using the method 200 of FIG. 5 described below to break an encountered trapping set, then in optional step 109, the extrinsic information $\sigma_{jl}^{(i*)}$ of the iteration can also be stored in a storage device accessible to the decoder (such as memory or other device) for further use and adjustment, if the i*-th iteration is the iteration having the minimum number of unsatisfied check nodes out of the iterations already performed (as described below with respect to FIG. 5). In some embodiments, this extrinsic information is stored only if the current iteration has the smallest number of unsatisfied check nodes. For example, in some embodiments, the extrinsic information and number of unsatisfied check nodes in the current iteration can be compared to a previously-stored minimum number of unsatisfied check nodes which is the smallest number of unsatisfied check nodes from all previous iterations; if the current number is smaller, the current extrinsic information and current number is stored, e.g., over the previous information. In other embodiments, all the extrinsic information is stored for every iteration, and the i*-th iteration and its extrinsic information are later determined in the method 200 of FIG. 5. Step 109 can also be performed at other times in method 100 or in different orders in other embodiments.

In step 110, at the end of the iteration, the posterior LLR $L_l^{(i)}$ of each bit l is computed and updated. These posterior LLRs can be determined using equation (5) described above. In step 112, based on the posterior LLRs $L_l^{(i)}$, a hard decision is made to obtain an estimate $\hat{v}^{(i)} = (\hat{v}_0^{(i)}, \hat{v}_1^{(i)}, \ldots, \hat{v}_{n-1}^{(i)})$ (i-th decoder state) of the codeword v using equation (6) described above.

In step 114, it is checked whether the stored number of unsatisfied check nodes $N_{UNC}$ is equal to the total number of unsatisfied check nodes $|S_{UCN}^{(i)}|$ at this iteration. If $N_{UNC}$ is not equal to $S_{UCN}^{(i)}|$, then it indicates that $|S_{UCN}^{(i)}|$ has changed since the last iteration due to updates of messages, indicating that the number of unsatisfied nodes is still changing in the iterative process and that nodes are still being satisfied, and thus a trapping set has not yet been encountered. Thus the process continues to step 116 to set the number $N_{UNC}$ equal to the current $|S_{UCN}^{(i)}|$ and the counter c is set equal to zero. The process then continues to step 120. If $N_{UNC}$ is equal to $|S_{UCN}^{(i)}|$ in step 114, then it indicates that $|S_{UCN}^{(i)}|$ has not changed since the last iteration, which may indicate that a type-1 trapping set has been encountered in which the decoder has reached a fixed state that has an unchanging number of unsatisfied nodes. Thus in step 118 the iteration counter c is incremented to count another iteration in which the state of the decoder is unchanged, and the process continues to step 120.

In step 120, it is checked whether any of the following conditions are met: $\hat{v}^{(i)} \cdot H = 0$, $c = \delta_{Itr}$, or $i = I_{max}$. The first condition checks whether the decoding has successfully produced an error-free codeword in accordance with the LDPC H matrix. The second condition checks whether the iteration counter c has reached the stop threshold $\delta_{Itr}$, which would indicate that the number of unsatisfied nodes has remained unchanged for an amount of times equal to $\delta_{Itr}$ and that the decoding process should be stopped due to becoming trapped by encountering a type-1 trapping set. The third condition checks whether the number of iterations has reached the maximum number of iterations $I_{max}$ for the decoding process which was determined before the decoding process started.

If none of these conditions are currently met, then the process should continue the decoding process with another iteration, such that in step 122 the iteration count i is incremented, and the process returns to step 106 to start another iteration and update the messages $\sigma_{jl}^{(i)}$ and $q_{jl}^{(i)}$. If one or more of the conditions are met in step 120, then in step 124 the process checks if $\hat{v}^{(i)} \cdot H = 0$. If not, then the decoding process did not produce a viable error-free codeword within the executed amount of iterations, and the process continues to step 126 to indicate a decoding failure and the method 100 is complete (the codeword can be output as a codeword with errors in some embodiments). In some embodiments, the decoder or receiver can output a failure indication to an appropriate component of the receiver's system, and appropriate action is taken. In embodiments that implement the methods described herein for breaking a trapping set and producing a decoded codeword, the process can continue to the beginning of the method 200 of FIG. 5, as described in detail below.

If $\hat{v}^{(i)} \cdot H = 0$ in step 124, then this indicates that a successful decoding of the received information has been performed to achieve a codeword $\hat{v}^{(I)}$. The process continues to step 128 to provide $\hat{v}^{(I)}$ as the output of the decoder, and the process is complete at 130.

Thus, the method 100 determines, based on a number of unsatisfied check nodes from each consecutive decoding iteration, if the decoder is trapped and determines whether to exit early from the decoding process before the maximum number of iterations has been reached, thereby reducing computation and latency. An advantage of method 100 is that it operates with any type of message-passing techniques for LDPC codes, such as SPA, MSA, etc., as well as any type of LDPC code (10 GBASE-T Ethernet, etc.) Therefore, the method 100 need not be altered for different decoding techniques or codes. Although the above process functions to stop the iterative decoding process when encountering type-1 trapping sets and not type-2 trapping sets, type-1 trapping sets are much more likely to occur in iterative decoding of LDPC codes.

Breaking Trapping Sets

An iterative decoding process declares a failure due to small trapping sets if it does not converge to a codeword after performing its iterations. The trapped variable nodes cannot be identified combinatorially. However, if some trapped variable nodes in a trapping set are determined as described below, the received sequence can be re-decoded with this new information and the decoder may not be trapped in this trapping set again. In the following embodiments, a process to find a set of possible trapped variable nodes based on unsatisfied check nodes is described.

FIG. 5 is a flow diagram illustrating a method 200 for breaking harmful trapping sets in an iterative decoding process. In general, the method 200 can be performed after a decoding failure has occurred by an iterative decoding process. In some embodiments, the method 200 can be used in conjunction with the method 100 detailed with respect to FIG. 4 which can stop the iterative decoding early. For example, the method 200 can continue from step 126 of method 100 of FIG. 4, where a decoding failure has been declared by the decoding process. In other embodiments, the method 200 can be used with a different message-passing iterative decoding method, e.g., with a standard iterative decoding method that declares decoding failure after reaching $I_{max}$ iterations. Method 200 can be implemented in a decoder by one or more processors or processing circuits and/or receiver similarly to method 100.

The process begins at 202, and in step 204, the process obtains the sets and quantities $S_{UCN}^{(i*)}$, $|S_{UCN}^{(i*)}|$, $S_{PTVN}^{(i*)}$, and $\sigma_{mb_j}^{(i*)}$. $S_{UCN}^{(i*)}$ is defined as the set of unsatisfied check nodes at an i*-th iteration, among all the iterations I that the decoder performed before failure, such that the number of unsatisfied check nodes is minimum, i.e., $$S_{UCN}^{(i*)} = \{S_{UCN}^{(i)} : \min_{0 \le i < I} |S_{UCN}^{(i)}|\} \quad (7)$$

The associated decoder state is $\hat{v}^{(i*)}$. $|S_{UCN}^{(i*)}|$ is the number of unsatisfied check nodes at this iteration i*. $S_{PTVN}^{(i*)}$ is the set of variable nodes at the iteration i* that are connected to the set $S_{UCN}^{(i*)}$ of unsatisfied check nodes on the Tanner graph, where each variable node in $S_{PTVN}^{(i*)}$ is identified as a possible trapped variable node. During the I iterations of decoding, the extrinsic information $\sigma_{jl}^{(i*)}$ of the i*-th iteration was also stored (an example of which is described above with respect to step 109 of FIG. 4), and this extrinsic information can be retrieved in step 204.

In step 206, the number of unsatisfied check nodes $|S_{UCN}^{(i*)}|$ is compared with $\delta_{UCN}$. The value $\delta_{UCN}$ is a predetermined threshold, such that the decoding failure is designated to have been caused by a "small" trapping set if $|S_{UCN}^{(i*)}|$ is less than or equal to $\delta_{UCN}$. The value $\delta_{UCN}$ can be determined by simulation or experimentation; e.g., in the example described below, $\delta_{UCN}$ is equal to 8. Thus, in the described embodiment, if $|S_{UCN}^{(i*)}|$ is greater than $\delta_{UCN}$, in step 206, the trapping set is not a small trapping set as defined by this method and thus is not handled by the current method. For example, in some embodiments, if $|S_{UCN}^{(i*)}|$ is greater than $\delta_{UCN}$, method 200 is not used to handle this trapping set because $S_{PTVN}^{(i*)}$ is large, the errors most likely are not from the trapping sets, and/or only small trapping sets tend to contribute to error floor. The process thus continues to step 207 to stop the process and exit the iterative decoding. In some embodiments, a failure is declared in the decoding, and/or the current state of the decoder is output as a codeword with errors. The process is then complete at 209.

If $|S_{UCN}^{(i*)}|$ is less than or equal to $\delta_{UCN}$ in step 206, then it is a small trapping set that may be able to be broken by the described method. The process continues to step 208 in which the variable j is set to 0. In next step 210, for each variable node $b_j \in S_{PTVN}^{(i*)}$, there is connection to the variable node $b_j$ from $\gamma$ check nodes in the Tanner graph of the LDPC code, where the $\gamma$ check nodes can include unsatisfied check nodes and satisfied check nodes. Step 210 adjusts the extrinsic information $\sigma_{mb_j}$ that is to be sent to the variable nodes $b_j$ from the $\gamma$ check nodes, where the extrinsic information $\sigma_{mb_j}$ is obtained from the extrinsic information $\sigma_{jl}^{(i*)}$ retrieved from memory.

The extrinsic information to the variable nodes $b_j$ is adjusted to break the trapping set. In some embodiments, the extrinsic information $\sigma_{mb_j}$ from a check node m to the variable node $b_j$ can be adjusted as follows:

$$\sigma_{mb_j} = \begin{cases} \sigma_{mb_j}^{(i*)} \times f_s & \text{if the check node } m \text{ is satisfied} \\ \sigma_{mb_j}^{(i*)} \times f_u & \text{if the check node } m \text{ is not satisfied} \end{cases} \quad (8)$$

The factors $f_s$ and $f_u$ are predetermined positive adjustment factors. These factors have the effect of increasing or decreasing the weight of the message provided from each check node to the variable node $b_j$ in later iterations. The decoder can continue correcting errors and break a trapping set if the messages coming from unsatisfied check nodes are strong enough to overcome the messages coming from the satisfied check nodes. Thus, step 210 decreases the weight of the messages from the satisfied check nodes, and increases the weight of the messages from the unsatisfied check nodes, and this will cause the processing at variable node $b_j$ to believe that there are more unsatisfied check nodes than satisfied check nodes. This causes the variable node $b_j$ to change state (flip its associated bit) in the process of trying to satisfy the unsatisfied check nodes, thereby breaking the unchanging decoder state that occurred because of the trapping set. Equation (8) effectively performs bit-flipping on all possible trapped variable nodes one time, and is a parallel bit-flipping technique.

In one example, if the check node is satisfied, the factor $f_s$ should be a fraction that decreases the weight (i.e. value) of the message from that check node, and if the check node is unsatisfied, the factor $f_u$ should be a larger value that increases the weight of the message from that check node. For example, in some embodiments, the factor $f_s$ can be between 0 and 1, and the factor $f_u$ can be greater than 1. In one example, $f_s=0.5$ and $f_u=2$, or in another example, $f_s=0.25$ and $f_u=1$.

In step 212, the variable j is incremented, and in step 214, the process checks whether there are more variable nodes $b_j$ for which to adjust extrinsic information. If so, then the process returns to step 210 to adjust the extrinsic information for the next variable node $b_j$. Once there are no further possible trapped variable nodes $b_j$ to process as determined in step 214, then in step 216 the process returns to the message-passing iterative decoding process to continue the decoding using the adjusted extrinsic information. For example, if using the method of FIG. 4 to perform decoding, the process returns to step 108 with the adjusted extrinsic information.

Thus the method 200, based on the minimal set of unsatisfied check nodes from all the iterations of the decoder has performed, determines a set of possible trapped variable nodes after decoding failure has occurred, adjusts the extrinsic information associated with those variable nodes, and continues the iterative decoding using that adjusted extrinsic information to break the trapping set and lower the error-floors of the LDPC code.

The method 200 can resolve most of the error events caused by small trapping sets in LDPC decoding, including both type-1 trapping sets and type-2 trapping sets. Furthermore, no prior knowledge of the codes' structure or the conditions of trapping sets is required for the method to operate and break trapping sets. Furthermore, trapping sets can be broken for any type of message-passing iterative technique, including SPA, MSA, and others. The method 200 can perform correctly and efficiently with any type of LDPC code (such as 10 GBASE-T Ethernet LDPC code), and is not specific to one particular LDPC code.

The described methods 100 and 200 can significantly decrease the error floor in LDPC decoding. For example, in some embodiments these methods can lower the error floor at least two orders of magnitude of BER relative to the standard techniques. Furthermore, these methods cause the iterative decoding to converge on the correct codeword very fast, such as within a few iterations. In addition, these methods require very little overhead of complexity and latency. Thus the methods can be useful in any technologies utilizing digital decoding and needing a low error floor of BER, including flash memory systems, wired or wireless communications, data transmission, and data storage systems.

Simulation results have confirmed the effectiveness of these techniques. An example of such simulation results is described below with reference to FIG. 6.

Figure 6:
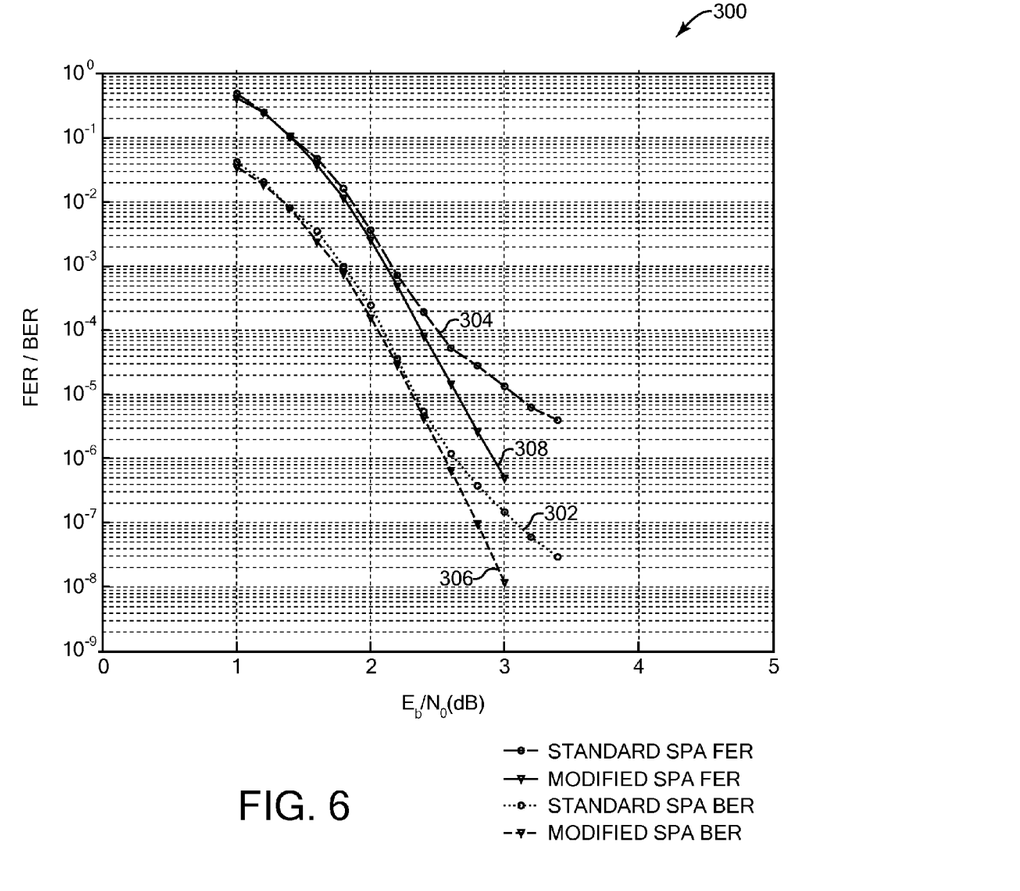
FIG. 6 is a graph illustrating one example of results using the decoding processes described herein to detect and break trapping sets.

FIG. 6 is a graph 300 illustrating one example of results using the decoding processes described above with reference to FIGS. 4 and 5 to detect and break trapping sets, showing the effectiveness of the described modified methods to lower error-floor of LDPC codes. In this example, the error performance of a (1056,528) LDPC code in the IEEE 802.16e WiMAX standard is shown. Standard SPA coding and the modified decoding of FIGS. 4 and 5 was used to benchmark the decoding performance shown in FIG. 6. Table 1 shows the decoding parameters used.

TABLE 1

| | |
|---|---|
| $I_{max}$ | 50 |
| $\delta_{Ier}$ | 5 |
| $\delta_{UCN}$ | 8 |
| $f_s$ | 0.5 |
| $f_u$ | 2 |

FIG. 6 shows the performance of the (1056,528) WiMAX LDPC code over an AWGN channel, where the vertical axis shows the bit error rate (BER) and frame error rate (FER) and the horizontal axis shows signal-to-noise ratio, SNR, ($E_b/N_0$ in dB). The error performance result of standard SPA decoding is depicted by curve 302 for BER, and by curve 304 for FER. The result of the modified decoding using the method embodiments described with reference to FIGS. 4 and 5 is depicted by curve 306 for BER, and by curve 308 for FER. As shown in FIG. 6, the performance of this LDPC code with the standard SPA decoding has an error-floor starting at about $5.5 \times 10^{-6}$ of BER. Using the modified decoding techniques of FIGS. 4 and 5, there is no error-floor down to $1.1 \times 10^{-8}$ of BER, and there is at least 2.5 orders of magnitude of BER.

Similarly, using the standard techniques FER error-floor occurs in this example at about $7.1 \times 10^{-4}$, and there is no FER error-floor down to about $5 \times 10^{-6}$ using the modified decoding techniques of FIGS. 4 and 5.

Based on the simulation results presented above, the described decoding techniques are quite effective to lower the error-floors of LDPC codes. In other embodiments, other types of error correcting codes similar to LDPC codes can be decoding using techniques the same as or similar to those described herein.

Although the present embodiments have been described in accordance with the examples shown, one of ordinary skill in the art will readily recognize that there could be variations to the embodiments and those variations would be within the spirit and scope of the present inventions. Accordingly, many modifications may be made by one of ordinary skill in the art without departing from the spirit and scope of the appended claims.

What is claimed is:

1. A method for decoding information, the method comprising:
   receiving transmitted information that includes original information coded using an error correction coding technique; and
   using at least one processor to iteratively decode the transmitted information to correct transmission errors and determine the original information, the iterative decoding having a predetermined maximum number of iterations, wherein the iterative decoding includes:
   determining that the iterative decoding has become trapped in a trapping set before the predetermined maximum number of iterations has been performed.

2. The method of claim 1 wherein in response to determining that the iterative decoding has become trapped in a trapping set, performing an exit from the iterative decoding before the predetermined maximum number of iterations has been performed.

3. The method of claim 2 wherein determining the decoding has become trapped includes determining that a number of unsatisfied check nodes has remained unchanged for a predetermined threshold number of consecutive iterations, the unsatisfied check nodes provided in a Tanner graph representing the error correction coding and having a plurality of check nodes and a plurality of variable nodes.

4. The method of claim 3 wherein the iterative decoding uses a message-passing technique to send messages as reliabilities between check nodes and variable nodes of the Tanner graph, the reliabilities associated with probabilities of bit values associated with the variable nodes.

5. The method of claim 3 further comprising, in response to the exiting from the iterative decoding, adjusting extrinsic information provided to possible trapped variable nodes from check nodes, the adjusting using predetermined adjustment factors to reduce or increase the values of the extrinsic information, and continuing the iterative decoding using the adjusted extrinsic information.

6. The method of claim 5 wherein the adjustment of extrinsic information causes a change of states of the possible trapped variable nodes.

7. The method of claim 1 wherein the determining that the decoding has become trapped includes determining that a state of a decoder has remained unchanged for a predetermined threshold number of consecutive iterations, wherein the predetermined threshold number is less than the predetermined maximum number of iterations.

8. The method of claim 1 wherein the error correction coding technique includes Low Density Parity Check (LDPC) codes.

9. The method of claim 8 wherein the determining that the iterative decoding has become trapped and performing an exit from the iterative decoding is performed regardless of the type of LDPC codes.

10. An apparatus for decoding information, the apparatus comprising:
    a memory; and
    at least one processor in communication with the memory, the at least one processor:
    receiving transmitted information that includes original information coded using an error correction coding technique; and
    implementing a decoder to iteratively decode the transmitted information to correct transmission errors and determine the original information, the iterative decoding having a predetermined maximum number of iterations, wherein the iterative decoding includes:
    determining that the iterative decoding has become trapped in a trapping set and performing an exit from the iterative decoding before the predetermined maximum number of iterations has been performed.

11. The apparatus of claim 10 wherein the decoding determining that the decoding has become trapped includes the decoding determining that a state of a decoder has remained unchanged for a predetermined threshold number of consecutive iterations, wherein the predetermined threshold number is less than the predetermined maximum number of iterations.

12. The apparatus of claim 10 wherein the at least one processor determining the decoding has become trapped includes determining that a number of unsatisfied check nodes has remained unchanged for a predetermined threshold number of consecutive iterations, the unsatisfied check nodes provided in a Tanner graph representing the error correction coding and having a plurality of check nodes and a plurality of variable nodes.

13. The apparatus of claim 12 wherein the at least one processor, in response to the exiting from the iterative decoding, adjusts extrinsic information provided to possible trapped variable nodes from check nodes, the adjusting using predetermined adjustment factors to reduce or increase the values of the extrinsic information, and continuing the iterative decoding using the adjusted extrinsic information.

14. The apparatus of claim 12 wherein the iterative decoding uses a message-passing technique to send messages as reliabilities between check nodes and variable nodes of the Tanner graph, the reliabilities associated with probabilities of bit values associated with the variable nodes.

15. The apparatus of claim 10 wherein the error correction coding technique includes Low Density Parity Check (LDPC) codes, and wherein the at least one processor determining that the iterative decoding has become trapped and performing an exit from the iterative decoding is performed regardless of the type of LDPC codes.

16. A computer program product comprising a non-transitory computer readable medium including program instructions to be implemented by a computer and for decoding information, the program instructions for:
receiving transmitted information that includes original information coded using an error correction coding technique; and
using at least one processor to implement a decoder to iteratively decode the transmitted information to correct transmission errors and determine the original information, the iterative decoding having a predetermined maximum number of iterations, wherein the iterative decoding includes:
determining that the iterative decoding has become trapped in a trapping set and performing an exit from the iterative decoding before the predetermined maximum number of iterations has been performed.

17. The computer program product of claim 16 wherein the determining that the decoding has become trapped includes determining that a state of a decoder has remained unchanged for a predetermined threshold number of consecutive iterations, wherein the predetermined threshold number is less than the predetermined maximum number of iterations.

18. The computer program product of claim 16 wherein determining the decoding has become trapped includes determining that a number of unsatisfied check nodes has remained unchanged for a predetermined threshold number of consecutive iterations, the unsatisfied check nodes provided in a Tanner graph representing the error correction coding and having a plurality of check nodes and a plurality of variable nodes.

19. The computer program product of claim 18 further comprising, in response to the exiting from the iterative decoding, adjusting extrinsic information provided to possible trapped variable nodes from check nodes, the adjusting using predetermined adjustment factors to reduce or increase the values of the extrinsic information, and continuing the iterative decoding using the adjusted extrinsic information.

20. The computer program product of claim 16 wherein the error correction coding technique includes Low Density Parity Check (LDPC) codes, and wherein the determining that the iterative decoding has become trapped and performing an exit from the iterative decoding is performed regardless of the type of LDPC codes.

* * * * *